United States Patent [19]
Todokoro et al.

[11] Patent Number: 4,629,889
[45] Date of Patent: Dec. 16, 1986

[54] POTENTIAL ANALYZER

[75] Inventors: Hideo Todokoro, Tokyo; Satoru Fukuhara, Kokubunji, both of Japan

[73] Assignee: Hitachi, Ltd., Tokyo, Japan

[21] Appl. No.: 623,083

[22] Filed: Jun. 21, 1984

[30] Foreign Application Priority Data

Jun. 24, 1983 [JP] Japan .................................. 58-112719

[51] Int. Cl.⁴ ............................................. G01N 23/00
[52] U.S. Cl. .................................. 250/310; 324/158 R
[58] Field of Search ............. 250/310; 324/51, 158 D, 324/158 R

[56] References Cited

U.S. PATENT DOCUMENTS 3,646,344 2/1972 Plows .................................... 250/310
3,714,424 1/1973 Weber .................................... 250/310
4,277,679 7/1981 Feuerbaum ........................ 250/310

Primary Examiner—Bruce C. Anderson
Attorney, Agent, or Firm—Antonelli, Terry & Wands

[57] ABSTRACT

A potential analyzer for analyzing a potential at a specimen such as an LSI device or the like. This analyzer comprises: a detector to detect secondary electrons to be emitted from a specimen by radiating a primary electron beam thereto; a retarding grid, provided between the specimen and the detector, for controlling a detection amount of the secondary electrons; a circuit for applying a voltage to the retarding grid to keep the output of the secondary electron detector at a constant value; and a setting circuit for automatically setting the gain of the detector so as to allow an operating range of the voltage to the retarding grid to be within a specified value.

6 Claims, 10 Drawing Figures

POTENTIAL ANALYZER

BACKGROUND OF THE INVENTION

The present invention relates to a potential analyzer for analyzing a potential at a surface of an object to be analyzed (for example, a potential in an LSI device) using an electron beam as a probe.

It is known that a potential at a portion where the electron beam is radiated can be measured with a scanning electron microscope by equipping it with an apparatus for analyzing energy of secondary electrons (refer to Japanese Patent Publication No. 51024/72).

FIG. 1A shows this principle. A retarding grid G is arranged between a specimen and a secondary electron detector 4 disposed to face the specimen 1. The retarding grid G forms a potential barrier to discriminate energy of secondary electrons 3 emitted from the specimen 1 due to its irradiation with an electron beam 2. FIG. 1B is a diagram showing the operation of this potential barrier. In the case where the retarding grid G is not used, every secondary electron 3 is detected by the secondary electron detector 4. An energy distribution of the secondary electrons emitted from the specimen 1 at zero potential is as shown by A in FIG. 1B. When the potential at the specimen 1 is at −5 V, the resulting secondary electron energy distribution is as indicated by B. When the retarding grid G is provided and a voltage of −5 V is applied thereto, secondary electrons to be detected are limited to those having 5 eV or more, so that a change occurs in the detection quantity of secondary electrons to be detected in dependence upon the potential at the specimen 1. In this way, since the secondary electron detection quantity relates to the potential at the specimen, the potential at the specimen 1 can be known from the detection quantity of secondary electrons.

However, in this method of analyzing the potential on the basis of only the arrangement of the retarding grid G, it is difficult to quantitatively analyze the potential since there is not a linear relation between the potential at the specimen 1 and the detection quantity of secondary electrons. Therefore, for linearization of the above-mentioned relation, a feedback loop operation is known in which the potential at the retarding grid is adjusted by a specific circuit so as to always maintain the detection quantity of secondary electrons constant (H. P. Feurbaum et al, IEEE Journal of solid state circuits, Vol. SC-13, No. 3, 1978).

FIG. 2 is a block diagram to describe this feedback loop operation. An output of the secondary electron detector 4 is compared with a reference voltage 6 and the difference is amplified by an amplifier 5 and its output is given to the retarding grid G. Since the potential at the retarding grid G decreases in association with an increase in the detection quantity of secondary electrons, even if the potential at the specimen 1 changes arbitrarily, the secondary electron detection quantity will be kept constant. Since an amount of change in the potential at the specimen is made to have a one-to-one correspondence to an amount of change of the retarding grid G, a change in the potential at the specimen 1 can be quantitatively known by measuring the potential at the retarding grid G.

However, to accurately perform this measurement, a variable range of the potential at the retarding grid G has to be set within a predetermined range. The gain of the secondary electron detector 4 is usually adjusted to make the detector 4 operative within this range. However, if the intensity of the primary electron beam changes or if the material is different from a specimen to another, this operating point will be changed, which will cause a large error in measurement. For example, in the case of measuring voltage waveforms on circuit lines in an LSI, there are a number of points to be measured therein and the resulting voltages are compared with each other. However, the materials of the circuit lines in the LSI are not always identical (for instance, Al, poly-Si, gold, etc.). Due to this, an emission efficiency of secondary electrons differs, so that the gain of the secondary electron detector 4 has to be adjusted to match with a specified operating point (potential at the retarding grid G). This adjustment is needed almost whenever the measurement point is changed. Namely, in the foregoing method, the adjustment has to be performed while always paying attention to the operating point, which makes this method complicated and brings about measurement errors therein.

SUMMARY OF THE INVENTION

The present invention has been made in consideration of such points and an object of the invention is to provide a potential analyzer which can automatically adjust its operating point.

To accomplish the above object, a potential analyzer according to one aspect of the present invention intends to automatically set an operating point of a retarding grid G and comprises: a detector for detecting secondary electrons to be emitted from a specimen by radiating a primary electron beam thereto; a retarding grid, disposed between the specimen and the detector, for controlling a detection amount of the secondary electrons; a circuit for applying a voltage to the retarding grid to maintain the output of the secondary electron detector at a constant value; and a setting circuit for setting the gain of the detector so that the operating range for the voltage to be applied to the retarding grid is within a specified value.

DESCRIPTION OF THE PREFERRED EMBODIMENTS

The present invention will be described in detail hereinbelow with reference to an embodiment.

Figure 1A:
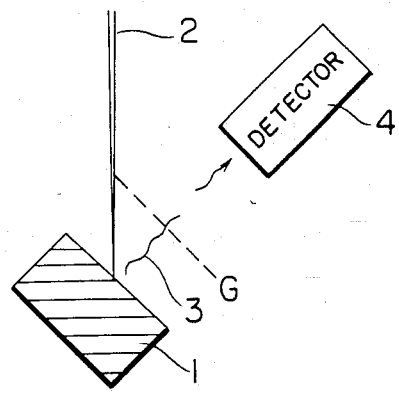
FIG. 1A is a diagram showing a construction to detect a potential of a specimen.
Figure 1B:
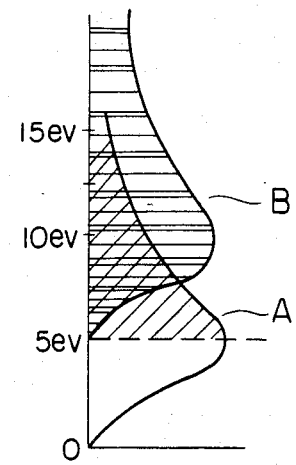
FIG. 1B is a diagram showing the principle of the potential detection.
Figure 2:
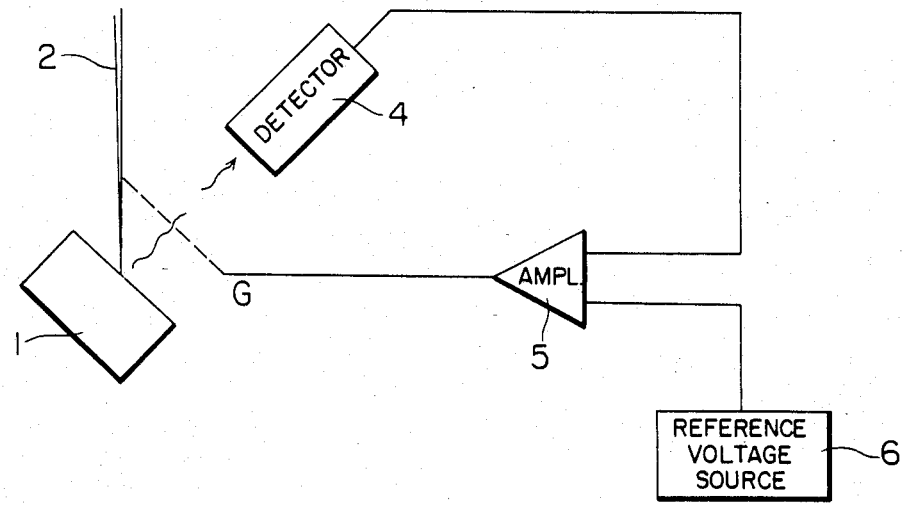
FIG. 2 is a diagram showing a feedback loop operation to measure changes in the potential at a specimen in one-to-one correspondence to those at the retarding electrode.
Figure 3:
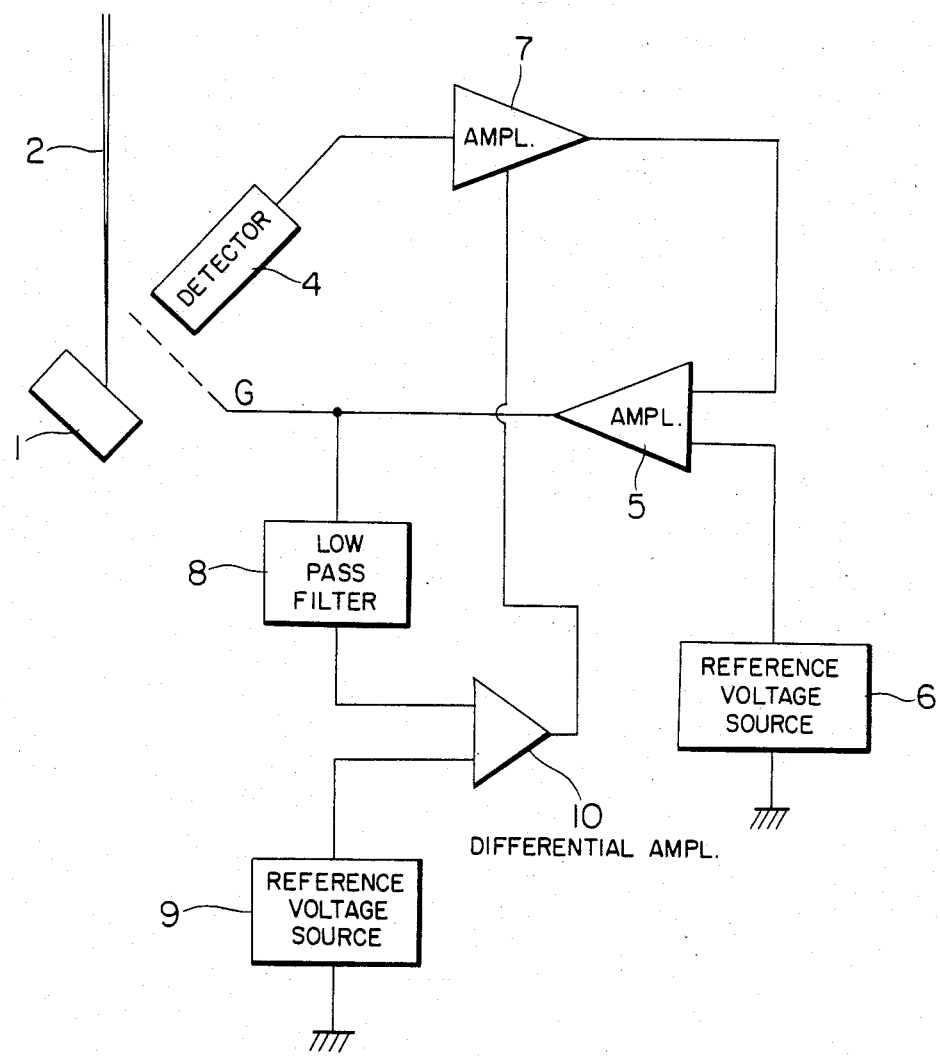
FIG. 3 is a diagram showing one embodiment of the present invention.
Figure 4A:
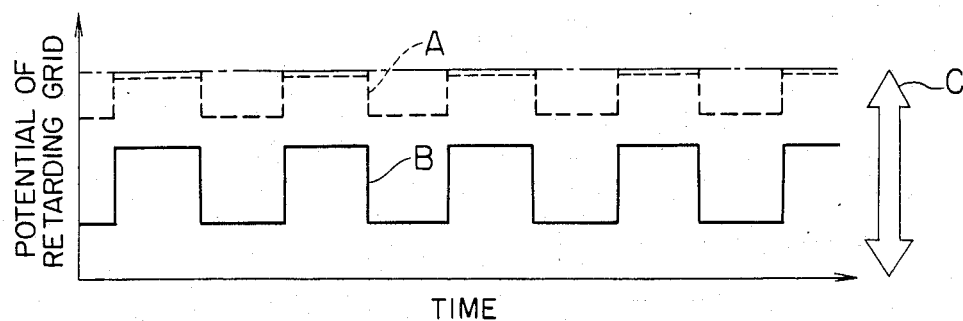
FIGS. 4A and 4B are waveform diagrams to describe the operations in the invention.

FIG. 3 is a block diagram showing one embodiment of the present invention. Generally, the potential at the specimen 1 (e.g., LSI device) to be analyzed is periodically changing. As already described in the conventional example of FIG. 2, the potential at the retarding grid G corresponds to the potential at the portion where the electron beam was radiated, owing to the use of the feedback loop circuit. A waveform B in FIG. 4A shows a retarding grid potential change when an operating potential of the retarding grid G is within a specified range C by adjusting the gain of the secondary electron detector 4. When such adjustment is wrong, an amplitude of the retarding grid potential change becomes small as shown by a waveform A, so that the measurement is not accurately performed.

In this embodiment, a low-pass filter 8 is connected to the retarding grid G and the output of the low pass filter 8 and a reference voltage source 9 for an operating point are compared using a differential amplifier or comparator 10 for setting an operating point, and its difference signal is fed back to an amplifier 7 for the secondary electron detector 4 so as to set the gain of the detector. The cut off frequency of the low pass filter 8 is set for a frequency which is sufficiently lower than the frequency to be measured in the specimen 1.

This operation will be explained using FIG. 4B. For example, it is now assumed that the operating point is inappropriate as indicated by the waveform A shown in FIG. 4A. In such a case, the output of the low pass filter 8 will be in such a waveform as indicated by A' in FIG. 4B, in which the high frequency components of the change in the retarding grid G have been removed. Although it is illustrated here that some variations still remain, if the frequency of the potential change in the specimen 1 is, for example, 100 Hz or higher and the cutoff frequency is 1 Hz, the waveform A' will become almost a straight line. The waveform A' is compared with a set potential E for the operating point. Since there is a large differential voltage D, the differential amplifier 10 generates a large output and acts to reduce the amplification degree of the amplifier 7. This operation is continued until the differential voltage becomes zero and finally stops with the waveform B' attained. In this way, the use of this method allows the mean value of the potentials at the retarding grid with respect to time to coincide with the reference voltage set for the operating point.

Figure 5:
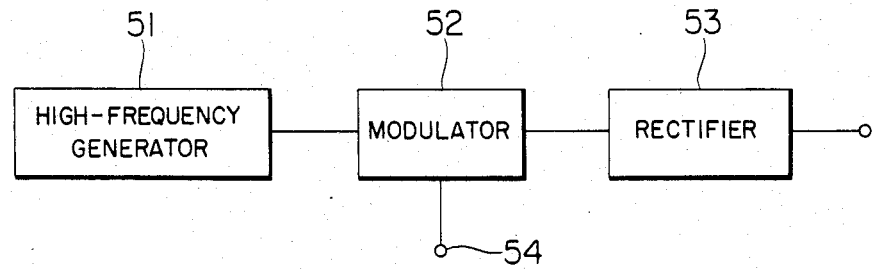
FIG. 5 is a block diagram showing an example of a method of adjusting a photomultiplier voltage.

In this embodiment, although the amplification degree of the amplifier 7 has been adjusted for adjusting the gain of the detector, the gain of the secondary electron detector 4, e.g., photomultiplier voltage may be adjusted. FIG. 5 shows an example of such a method of adjusting the photomultiplier voltage. The voltage to be applied to the photomultiplier is generally a DC voltage of 0 to 1000 V. This DC voltage is formed by generating a high frequency voltage from a high-frequency generator 51 and rectifying this by, for example, a so-called Cockcroft-Walton type rectifier 53. By varying the output of the high-frequency generator 51, the photomultiplier voltage is preset for a value near the operating point. This operation is in most cases performed when the secondary electron image is observed to determine the analyzing portions. The automatic adjustment of the photomultiplier voltage is performed by providing a modulator 52 in the post stage of the high-frequency generator 51. This modulator 52 will pass the output of the generator 51, without its modulation, to the rectifier 53 when an input voltage 54 is zero, will attenuate the output of the generator 51 when the input voltage 54 is positive, and will amplify the output of the generator 51 when the input voltage 54 is negative. This operation equivalently corresponds to that of the amplifier 7 and provides the effect of the invention.

Figure 4B:
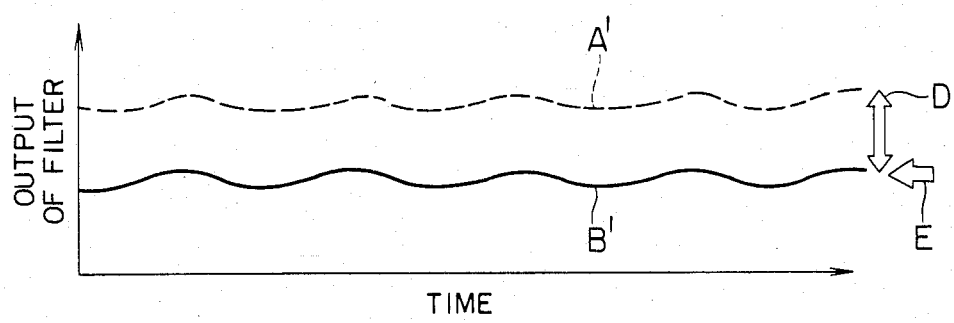

The method whereby the mean value of the potential change of the retarding grid G is compared with the reference value has been described in conjunction with FIGS. 4A and 4B. Instead of using the mean value obtained from the low pass filter to compare with reference value, the highest value or lowest value of the changes may be detected and used for the automatic adjustment of operating point. This method is also useful.

Figure 6:
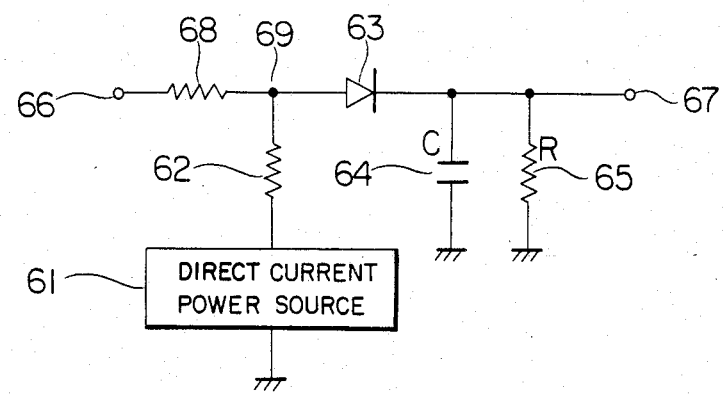
FIG. 6 is a diagram showing another embodiment of the invention.

FIG. 6 shows an example of a circuit to detect the highest value in the case of detecting the highest value in another embodiment of the invention. The circuit example of FIG. 6 may be substituted for the low pass filter 8 in FIG. 3. A terminal 66 is in electrical connection to the grid G and a terminal 67 is in electrical connection to the differential amplifier 10 for setting the operating point. Since the voltage at the terminal 66 changes within a range from a positive to negative value, a DC component is added by means of resistors 68 and 62 and a positive DC power source 61 so that the voltage at a terminal 69 is always positive. Only when the potential at the terminal 69 is higher than that across a capacitor 64 having a capacitance C, a current flows through a diode 63 to the capacitor 64. Thus, the highest potential value is stored in the capacitor 64. A discharge resistor 65 having a resistance R is provided for this capacitor 64. This discharge time constant is determined by R and C and is practically set to be substantially equal to the time constant of the low pass filter 8 which may be one second or so. In this example although the case where the highest value is used has been described, it is also possible to perform such automatic adjustment similarly using the lowest value.

Figure 7:
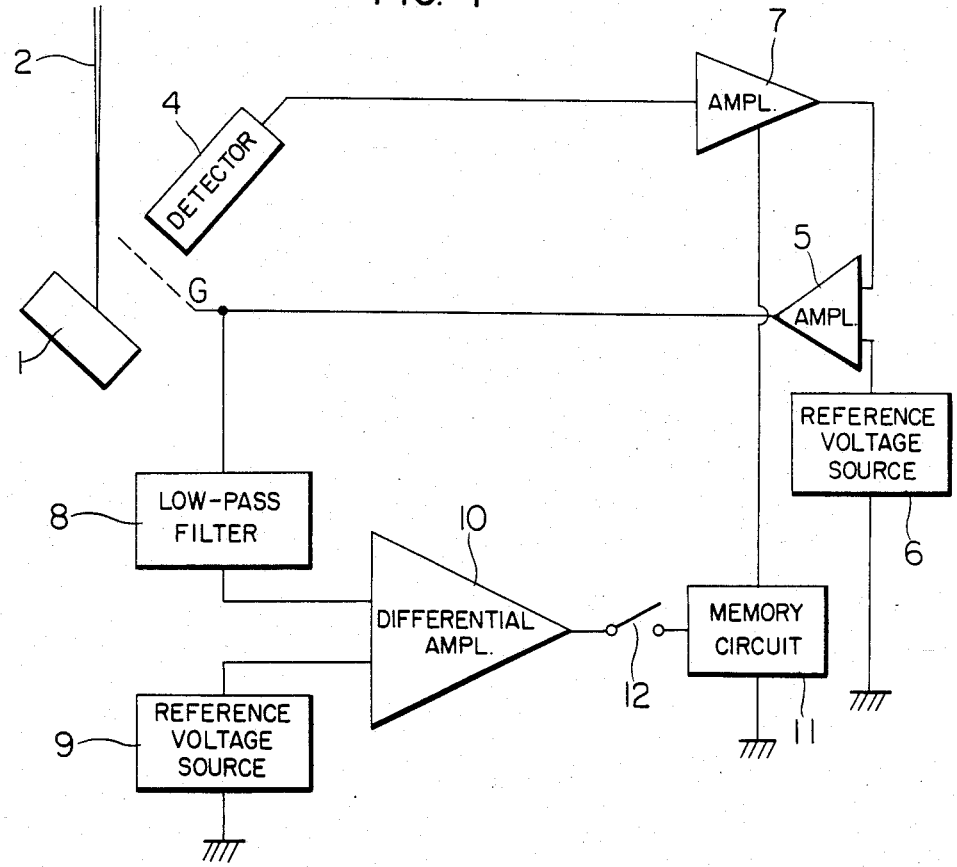
FIGS. 7 and 8 are diagrams showing further other embodiments of the invention, respectively.

In the above-described embodiment, the circuit for setting the operating point is always operating. In still another embodiment of the invention shown in FIG. 7, the circuit for setting the operating point is not always made operative. That is, in this embodiment, the output of the differential amplifier 10 for setting the operating point is connected to the amplifier 7 through a switch 12 and a memory circuit 11. The switch 12 is turned on immediately before the measurement is started. The operating point is set in one to ten seconds for a point determined by the reference voltage source 9 for giving the operating point, owing to the circuit structure including the filter 8, source 9, amplifier 10 and memory circuit 11. It may be apparently set for the mean value, highest value or lowest value. After the switch 12 is turned off, the voltage of the output of the differential amplifier 10 when the switch 12 is on is recorded in the memory circuit 11 and the amplification degree of the amplifier 7 is determined in response to this voltage and the operating point is not changed. The measurement is performed (measurement data is obtained) after the switch 12 is turned off. The simplest example of the memory circuit 11 is constituted by a combination of a motor and a potentiometer. Since use is often made of a microcomputer to control the memory circuit, the memory circuit may be implemented by a semiconductor device or the like. In such a case, the ON-OFF operation of the switch 12, collection of data and the like are automatically performed in response to an execution instruction of measurement. With such a constitution, it is possible to eliminate an error of measurement which sometimes occurs when the frequency to be analyzed becomes a low frequency near the cutoff frequency of the low pass filter 8 in the foregoing embodiment.

Figure 8:
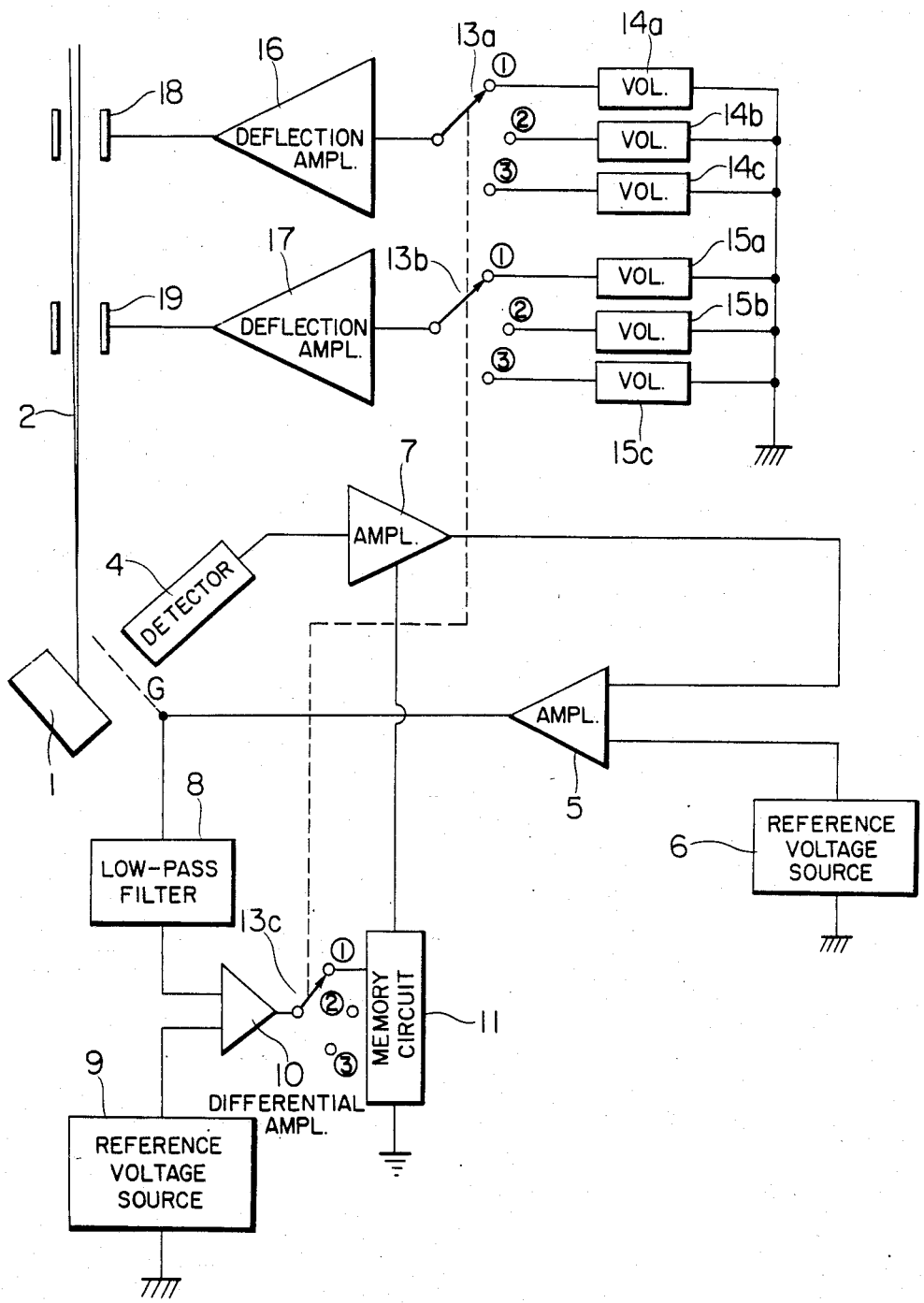

Although the number of measuring portions, i.e., the number of portions where the primary electron beam is radiated is one in the above embodiment, in many cases in the actual measurement, a plurality of portions are measured and the data obtained from those portions are compared. In such a case, the present invention can be effectively utilized. FIG. 8 shows an embodiment for this purpose. In this embodiment, an X deflector 18 and a Y deflector 19 which are used to move the portion to be irradiated by the primary electron beam 2 are interconnected to the operating point setting circuit. The X deflector 18 and Y deflector 19 are driven by an X deflection amplifier 16 and a Y deflection amplifier 17, respectively. The output of the X deflection amplifier 16 is varied through a change-over switch 13a by position setting voltage circuits 14a, 14b and 14c. The output of the Y deflection amplifier 17 is varied through a change-over switch 13b by position setting voltage circuits 15a, 15b and 15c. The position setting voltage circuits 14a, 14b, 14c, 15a, 15b and 15c are arbitrarily changed by an operator. For example, the change-over switches 13a and 13b are set at position ① and the measuring portion (A) is determined by the position setting voltage circuits 14a and 15a. This operation may be alternatively performed at positions ② and ③. Then, the measuring portions (A), (B) and (C) are determined. Thereafter, the measurement is performed.

First, the interlocked change-over switches 13a, 13b and 13c are set at positions ①. In this case, the switch 13c is turned on and the corresponding operating point setting circuit is made operative, so that the operating point is automatically set. Then, the switches are set at position ② and the measurement is done, thereby allowing the potential at the retarding grid G to be recorded or to be memorized by a circuit. Subsequently, the switches are set at position ③ and the similar measurement is done. By subtracting the value of the reference voltage source 9 at the operating point from the resulting measurement values at (B) and (C), the voltages at the points (B) and (C) are analyzed using the voltage at the point (A) as a reference. If the point (A) is used as the earth electrode, the potentials at the points (B) and (C) could be analyzed by this measurement. In addition, by using the method whereby the switching operations of (A), (B) and (C) are repeatedly performed a number of times, it is also possible to correct the measurement error (variation in the primary electron beam or the like) regarding the time. The operation in this embodiment can be easily performed by increasing the measuring points or the like due to the control by a computer.

The method of the present invention can be applied using the substantially similar circuit even in case of the potential measurement by a so-called stroboscopic method in which the electron beam is pulse modulated in synchronism with a change in the specimen (for example, the driving frequency for the LSI) and thereby to also enable the high frequency potential of the order of 1 to 100 MHz to be analyzed.

As described above, according to the present invention, since the operating point of the feedback loop circuit for analyzing the potential can be automatically set, it is possible to remove the complicated factors which causes measurement errors as in the conventional analyzer and the operability is remarkably improved. The invention will be effective if it is used to examine the functions and defects and the like of LSI devices or the like.

We claim:

1. A potential analyzer for analyzing a potential at a surface of a specimen comprising:
    detector means for detecting secondary electrons emitted from the specimen by radiating a primary electron beam thereto;
    retarding grid means, disposed between said detector means and said specimen, for controlling a detection amount of said secondary electrons;
    circuit means for applying a voltage to said retarding grid means to maintain an output of said detector means at a constant value; and
    setting circuit means for setting the gain of said detector means so as to allow an operating range of the voltage to said retarding grid means to be within a specified value;
    wherein said setting circuit means includes a low pass filter circuit for detecting a variation in the voltage of said retarding grid means to set the gain of said detector means on the basis of said detected variation.

2. A potential analyzer for analyzing a potential at a surface of a specimen comprising:
    detector means for detecting secondary electrons emitted from the specimen by radiating a primary electron beam thereto;
    retarding grid means, disposed between said detector means and said specimen, for controlling a detection amount of said secondary electrons;
    circuit means for applying a voltage to said retarding grid means to maintain an output of aaid detector means at a constant value; and
    setting circuit means for setting the gain of said detector means so as to allow an operating range of the voltage to said retarding grid means to be within a specified value;
    wherein said setting circuit means includes means for detecting the highest value of lowest value of variations in the voltage of said retarding grid means to set the gain of said detector means on the basis of said detected value.

3. A potential analyzer for analyzing a potential at a surface of a specimen comprising:
    detector means for detecting secondary electrons emitted from the specimen by radiating a primary electron beam thereto;
    retarding grid means, disposed between said detector means and said specimen, for controlling a detection amount of said secondary electrons;
    circuit means for applying a voltage to said retarding grid means to maintain an output of said detector means at a constant value; and
    setting circuit means for setting the gain of said detector means so as to allow an operating range of the voltage to said retarding grid means to be within a specified value;
    wherein said setting circuit means is arranged such that it is made inoperative after having been made operative for an interval immediately before analyzing the potential at the surface of said specimen, and thereafter the state of said operation of said setting circuit means is maintained.

4. A potential analyzer for analyzing a potential at a surface of a specimen comprising:

detector means for detecting secondary electrons emitted from the specimen by radiating a primary electron beam thereto;

retarding grid means, disposed between said detector means and said specimen, for controlling a detection amount of said secondary electrons;

circuit means for applying a voltage to said retarding grid means to maintain an output of said detector means at a constant value; and setting circuit means for setting the gain of said detector means so as to allow an operating range of the voltage to said retarding grid means to be within a specified value;

wherein portions to be analyzed of said specimen where said primary electron beam is radiated are a plurality of portions and there is further provided means for making said setting circuit means operative at least a single portion among them and holding said set operating point at the other measuring portions.

5. A potential analyzer according to claim 4, further comprising means for repeating the movement of said measuring portions a number of times and repeating the setting operations of the operating points and the measuring operations a number of times, thereby outputting a mean value of the measurement values as a measurement result.

6. A potential analyzer for analyzing a potential at a surface of a specimen comprising:

detector means for detecting secondary electrons emitted from the specimen by radiating a primary electron beam thereto;

retarding grid means, disposed between said detector means and said specimen, for controlling a detection amount of said secondary electrons;

circuit means for applying a voltage to said retarding grid means to maintain an output of said detector means at a constant value; and setting circuit means for setting the gain of said detector means so as to allow an operating range of the voltage to said retarding grid means to be within a specified value;

wherein said detector means includes a detector and an amplifying circuit for receiving and amplifying the output of said detector, said amplifying circuit having an adjustable gain for setting the gain of said detector means, and said setting circuit means setting the gain of said amplifier circuit.

* * * * *